US011972325B2

(12) United States Patent
Okudaira

(10) Patent No.: US 11,972,325 B2
(45) Date of Patent: Apr. 30, 2024

(54) DETERMINATION METHOD, DETERMINATION DEVICE, EXPOSURE DEVICE, AND PROGRAM

(71) Applicant: NIKON CORPORATION, Tokyo (JP)

(72) Inventor: Yosuke Okudaira, Tokyo (JP)

(73) Assignee: Nikon Corporation, Tokyo (JP)

(*) Notice: Subject to any disclaimer, the term of this patent is extended or adjusted under 35 U.S.C. 154(b) by 338 days.

(21) Appl. No.: 17/487,930

(22) Filed: Sep. 28, 2021

(65) Prior Publication Data
US 2022/0092463 A1 Mar. 24, 2022

Related U.S. Application Data

(63) Continuation of application No. PCT/JP2019/014038, filed on Mar. 29, 2019.

(51) Int. Cl.
G06N 10/60 (2022.01)
G02B 26/08 (2006.01)
G03F 7/00 (2006.01)
G06T 7/00 (2017.01)

(52) U.S. Cl.
CPC ......... *G06N 10/60* (2022.01); *G02B 26/0833* (2013.01); *G03F 7/7055* (2013.01); *G06T 7/001* (2013.01); *G06T 2207/30148* (2013.01)

(58) Field of Classification Search
CPC .... G06N 10/60; G06N 10/40; G02B 26/0833; G03F 7/7055; G03F 7/70291; G03F 7/70508; G03F 7/20; G06T 7/001; G06T 2207/30148
See application file for complete search history.

(56) References Cited

U.S. PATENT DOCUMENTS

2009/0116093 A1* 5/2009 Tanitsu ............... G03F 7/70075
359/239
2011/0181855 A1* 7/2011 Bittner ............... G03F 7/70525
355/55

(Continued)

FOREIGN PATENT DOCUMENTS

CN 102165371 A 8/2011
CN 107683460 A 2/2018
DE 102008042356 A1 4/2010

(Continued)

OTHER PUBLICATIONS

Edward Farhi et al., A Quantum Adiabatic Evolution Algorithm Applied to Random Instances of an NP-Complete Problem, Science Apr. 20, 2001, vol. 292, Issue 5516, pp. 472-475.

(Continued)

*Primary Examiner* — Christopher M Brandt
(74) *Attorney, Agent, or Firm* — Finnegan, Henderson, Farabow, Garrett & Dunner, L.L.P.

(57) ABSTRACT

A determination method includes causing the state in each of the plurality of pixels to correspond to a plurality of states of a plurality of bits of an Ising model, and setting an evaluation function for evaluating a degree of coincidence between the target image and the formed image as a function of the plurality of bits, and determining which one of the plurality of states is to be set for each of the plurality of pixels on the basis of states of the plurality of bits included in a result obtained by evaluating the evaluation function by an Ising machine.

17 Claims, 13 Drawing Sheets

(56) References Cited

U.S. PATENT DOCUMENTS

2016/0328253 A1* 11/2016 Majumdar ............. G06N 3/126
2019/0019100 A1    1/2019 Roques-Carmes et al.

FOREIGN PATENT DOCUMENTS

| JP | 2011-503835 A | 1/2011 |
| JP | 2012-212884 A | 11/2012 |
| JP | 2018-521382 A | 8/2018 |
| KR | 10-2010-0095566 A | 8/2010 |
| KR | 10-2011-0047250 A | 5/2011 |
| KR | 10-2018-0004226 A | 1/2018 |
| TW | 200928611 A | 7/2009 |
| TW | 201019041 A | 5/2010 |
| WO | WO 2009/060773 A1 | 5/2009 |
| WO | WO 2010/034674 A1 | 4/2010 |
| WO | WO 2016/179419 A1 | 11/2016 |
| WO | WO 2019/014345 A1 | 1/2019 |

OTHER PUBLICATIONS

International Search Report for International Application No. PCT/JP2019/014038, dated Jun. 18, 2019 (4 pages).
Babbush et al.; "Resource Efficient Gadgets for Compiling Adiabatic Quantum Optimization Problems", arXiv:1307.8041v1, Annalen der Physik, vol. 25, Issue 10-11, 11 pages (2013).
Cobb; "Sum of Coherent Systems Decomposition by SVD", Department of Electrical Engineering and Computer Science University of California at Berkeley, 7 pages (1995).

* cited by examiner

DETERMINATION METHOD, DETERMINATION DEVICE, EXPOSURE DEVICE, AND PROGRAM

The contents of the following International patent application are incorporated herein by reference:
PCT/JP2019/014038 filed on Mar. 29, 2019

BACKGROUND

1. Technical Field

The present invention relates to a determination method, a determination device, an exposure device, and a computer readable medium.

2. Related Art

In recent years, a device that performs calculation specialized for quantum annealing has been developed, and an environment in which the device can be used is being prepared. Although quantum annealing is useful for solving a combinatorial optimization problem such as a traveling salesman problem, there are still few optimization problems that are known to be applicable, and it cannot be said that a device that performs calculation specialized for quantum annealing is sufficiently used (Edward Farhi et al., A Quantum Adiabatic Evolution Algorithm Applied to Random Instances of an NP-Complete Problem, Science 20 Apr. 2001, Vol. 292, Issue 5516, pp. 472-475).

GENERAL DISCLOSURE

Therefore, in one aspect of technical innovation included in the present specification, an object is to provide a determination method, a determination device, an exposure device, and a computer readable medium recording a program that can solve the above problems. This object is achieved by a combination of the features described in the claims. That is, in the first aspect of the present invention, there is provided a determination method for determining, from a formed image obtained by imaging at least one of reflected light and transmitted light of light illuminated by a spatial light modulation element including a plurality of pixels disposed at spatially different positions from each other, and transmitted light of light irradiated to a mask in which a plurality of minute regions that are virtually divided is regarded as the plurality of pixels, to which one of a plurality of states each of the plurality of pixels is to be set in order to form a target image that is an image satisfying a target condition on an object. The determination method may have causing the state in each of the plurality of pixels to correspond to a plurality of states of a plurality of bits of an Ising model, and setting an evaluation function for evaluating a degree of coincidence between the target image and the formed image as a function of the plurality of bits. The determination method may include determining which one of the plurality of states is to be set for each of the plurality of pixels on the basis of states of the plurality of bits included in a result obtained by evaluating the evaluation function by an Ising machine.

According to a second aspect of the present invention, there is provided a determination device for determining, from a formed image obtained by imaging at least one of reflected light and transmitted light of light illuminated by a spatial light modulation element including a plurality of pixels disposed at spatially different positions from each other, and transmitted light of light irradiated to a mask in which a plurality of minute regions that are virtually divided is regarded as the plurality of pixels, to which one of a plurality of states each of the plurality of pixels is to be set in order to form a target image that is an image satisfying a target condition on an object. The determination device may include a setting unit configured to cause the state in each of the plurality of pixels to correspond to a plurality of states of a plurality of bits of an Ising model, and set an evaluation function for evaluating a degree of coincidence between the target image and the formed image as a function of the plurality of bits. The determination device may include a determination unit configured to determine which one of the plurality of states is to be set for each of the plurality of pixels on the basis of states of the plurality of bits included in a result obtained by evaluating the evaluation function by an Ising machine.

There is provided a computer readable medium having recorded thereon a program to cause a computer to determine, from a formed image obtained by imaging at least one of reflected light and transmitted light of light illuminated by a spatial light modulation element including a plurality of pixels disposed at spatially different positions from each other, and transmitted light of light irradiated to a mask in which a plurality of minute regions that are virtually divided is regarded as the plurality of pixels, to which one of a plurality of states each of the plurality of pixels is to be set in order to form a target image that is an image satisfying a target condition on an object. The computer may be caused to execute causing the state in each of the plurality of pixels to correspond to a plurality of states of a plurality of bits of an Ising model, and setting an evaluation function for evaluating a degree of coincidence between the target image and the formed image as a function of the plurality of bits. The computer may be caused to execute determining which one of the plurality of states is to be set for each of the plurality of pixels on the basis of states of the plurality of bits included in a result obtained by evaluating the evaluation function by an Ising machine.

Note that the above summary of the invention does not enumerate all the necessary features of the present invention, and a sub-combination of these feature groups can also be the invention.

DESCRIPTION OF EXEMPLARY EMBODIMENTS

The embodiments do not limit the invention according to the claims, and all the combinations of the features described in the embodiments are not necessarily essential to means provided by aspects of the invention.

First Embodiment

Figure 1:
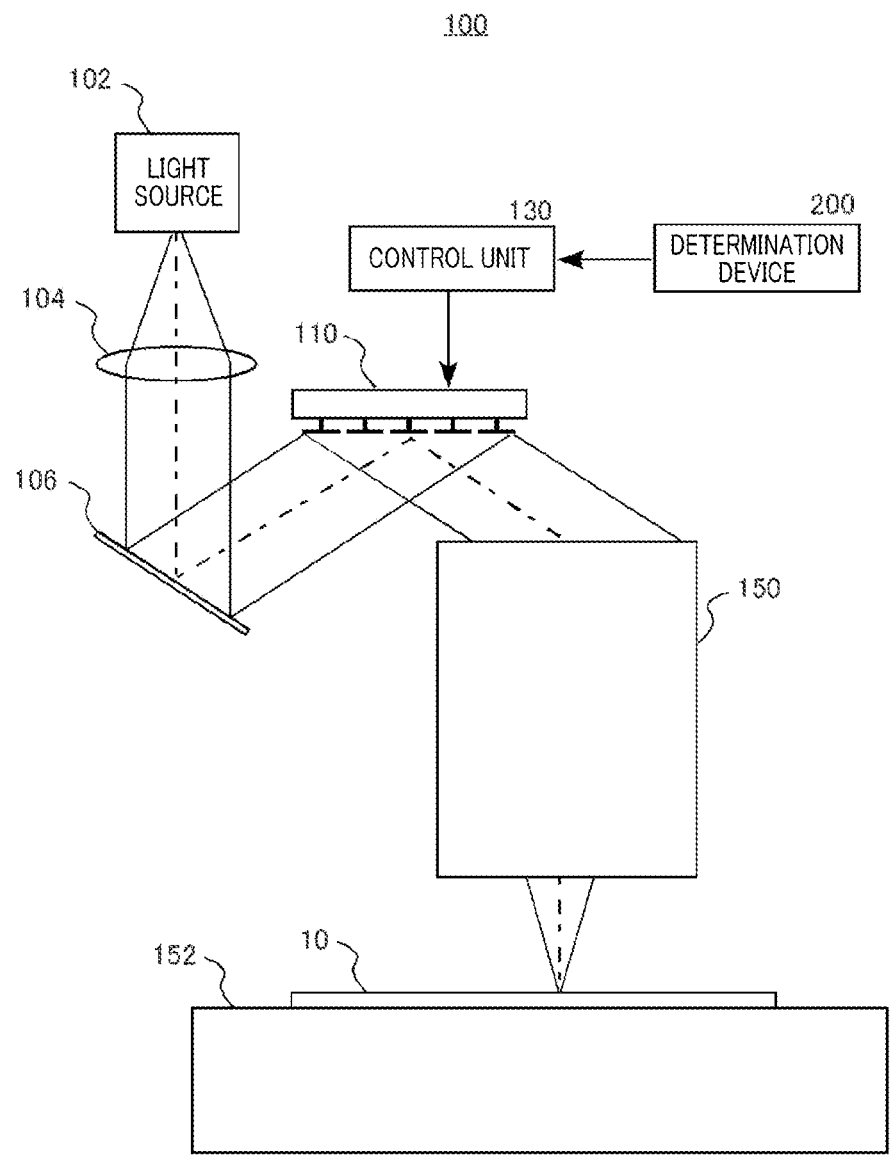
FIG. 1 schematically illustrates an exposure device according to the present embodiment.

FIG. 1 schematically illustrates an exposure device 100 according to the present embodiment. The exposure device 100 performs exposure in photolithography by forming a formed image on a wafer 10 which is an example of an object. The exposure device 100 includes a light source 102, a first optical system 104, a reflecting mirror 106, a spatial light modulation element 110, a control unit 130, a second optical system 150, and a determination device 200.

The light source 102 outputs light used for exposure. The wavelength of light is not particularly limited, and is, for example, 248 nm for KrF, 13.5 nm for EUV, or the like. The first optical system 104 adjusts the light from the light source 102 to a predetermined light flux, such as collimating. Note that, although the first optical system 104 is represented by one lens in the drawing for simplification, a plurality of lenses or other optical elements may be used. The reflecting mirror 106 reflects the light from the first optical system 104 and directs the main line direction of the light toward the spatial light modulation element 110.

The control unit 130 controls the spatial light modulation element 110. As a result, the spatial light modulation element 110 inputs at least a part of the light from the reflecting mirror 106 to the second optical system 150.

The second optical system 150 forms an image of the light input from the spatial light modulation element 110 on the wafer 10. Similarly to the first optical system 104, the second optical system 150 is illustrated in a simplified manner. A stage 152 holds the wafer 10.

The determination device 200 determines control information indicating how to control the spatial light modulation element 110 and outputs the control information to the control unit 130.

Figure 2:
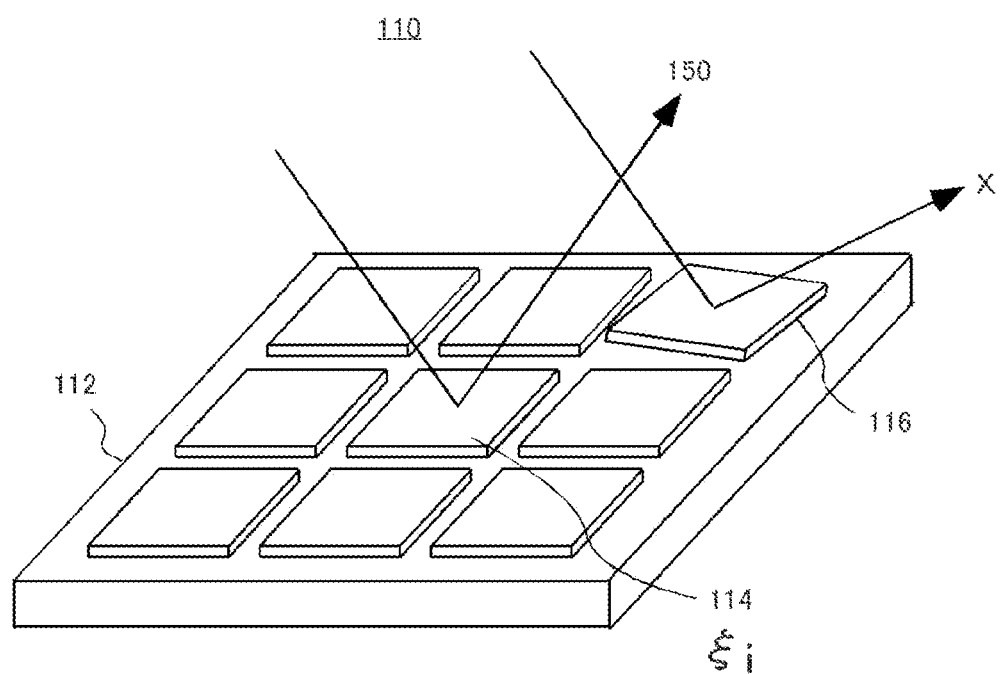
FIG. 2 schematically illustrates a spatial light modulation element.

FIG. 2 schematically illustrates the spatial light modulation element 110. The spatial light modulation element 110 includes a plurality of micromirrors 114 and 116 spatially disposed at different positions on a substrate 112. The plurality of micromirrors 114 and 116 are arranged in a lattice shape in the plane direction of the substrate 112. In FIG. 2, nine micromirrors of 3×3 are illustrated for simplification, but the number of micromirrors may be larger, for example. 1000×1000.

Each of the plurality of micromirrors 114 and 116 can independently take either a first state or a second state under the control of the control unit 130. The first state is a state in which the micromirror is not inclined with respect to the substrate 112, and reflects the incident light toward the second optical system 150 as illustrated by the micromirror 114 of FIG. 2. This is referred to as a first light state. On the other hand, the second state is a state in which the micromirror is inclined with respect to the substrate 112, and does not reflect the incident light toward the second optical system 150 as illustrated by the micromirror 116 of FIG. 2. That is, the light is reflected in a direction different from that of the second optical system 150. This is referred to as a second light state. The second light state is different from the first light state. Such a spatial light modulation element 110 is also called a reflective light conversion modulation element.

For convenience of calculation, the position of the i-th micromirror 114 can be represented by $x_i$, and the state can be represented by a numerical value $\xi_i$. For example, the first state is represented by $\xi_i=1$, and the second state is represented by $\xi_i=0$. It can also be said that each of the micromirrors 114 and 116 is a pixel for forming a formed image. Therefore, the micromirror 114 is also referred to as a pixel.

Figure 3:
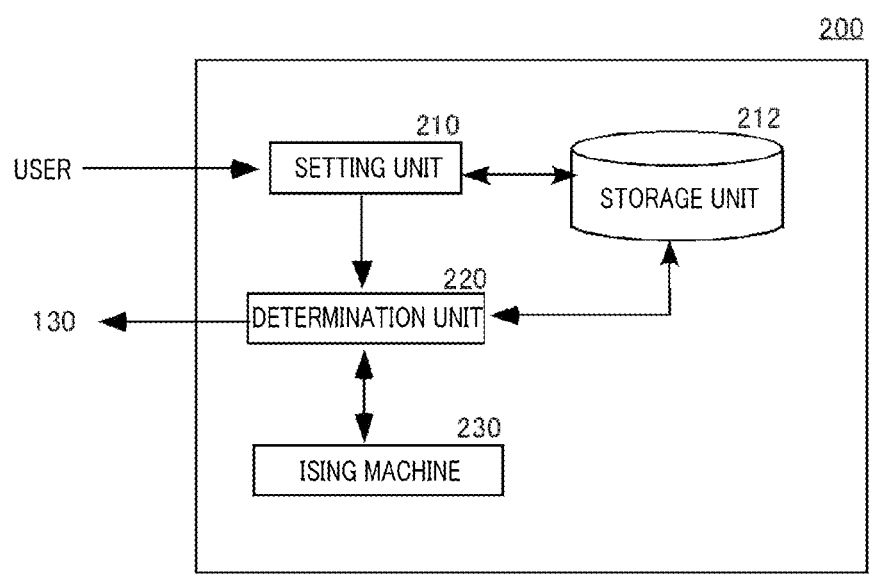
FIG. 3 is a functional block diagram of a determination device.

FIG. 3 is a functional block diagram of the determination device 200. The determination device 200 includes a setting unit 210, a storage unit 212, a determination unit 220, and an Ising machine 230.

The setting unit 210 sets a target image that is an image satisfying a target condition on the wafer 10 and a formed image obtained by imaging the reflected light of the light set in the spatial light modulation element 110. Further, the setting unit 210 sets an evaluation function for evaluating the degree of coincidence between the target image and the formed image on the basis of the target image and the set image.

The determination unit 220 acquires the states of a plurality of bits included in the result obtained by evaluating the evaluation function by the Ising machine 230. Further, the determination unit 220 determines which one of a plurality of states is to be set for each of the plurality of pixels of the spatial light modulation element 110 on the basis of the states of the plurality of bits. The determination unit 220 outputs information indicating the determined state to the control unit 130. Note that an output destination is not limited to the control unit 130, and may be stored in the storage unit 212 or displayed on a display unit.

The Ising machine 230 is a device that calculates the ground state of the Ising model, which will be described later, with given physical quantities. In case of that quantum annealing is used, the Ising machine 230 is also called an (quantum) annealing machine. The quantum annealing will be described later.

Figure 4:
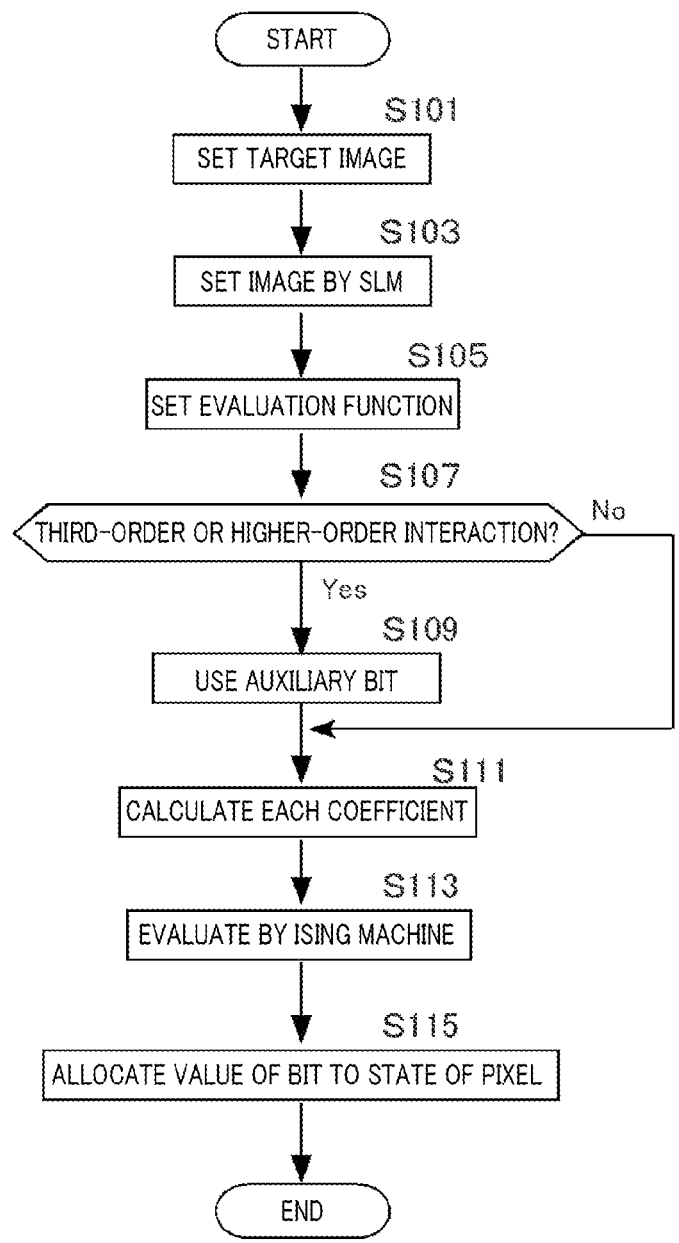
FIG. 4 is a flowchart of a determination method in the present embodiment.

FIG. 4 is a flowchart of a determination method in the present embodiment. In this flowchart, first, a target image is set (S101). For example, an input of image data is received from a user, and the setting unit 210 sets a target image on the basis of the image data.

Figure 5:
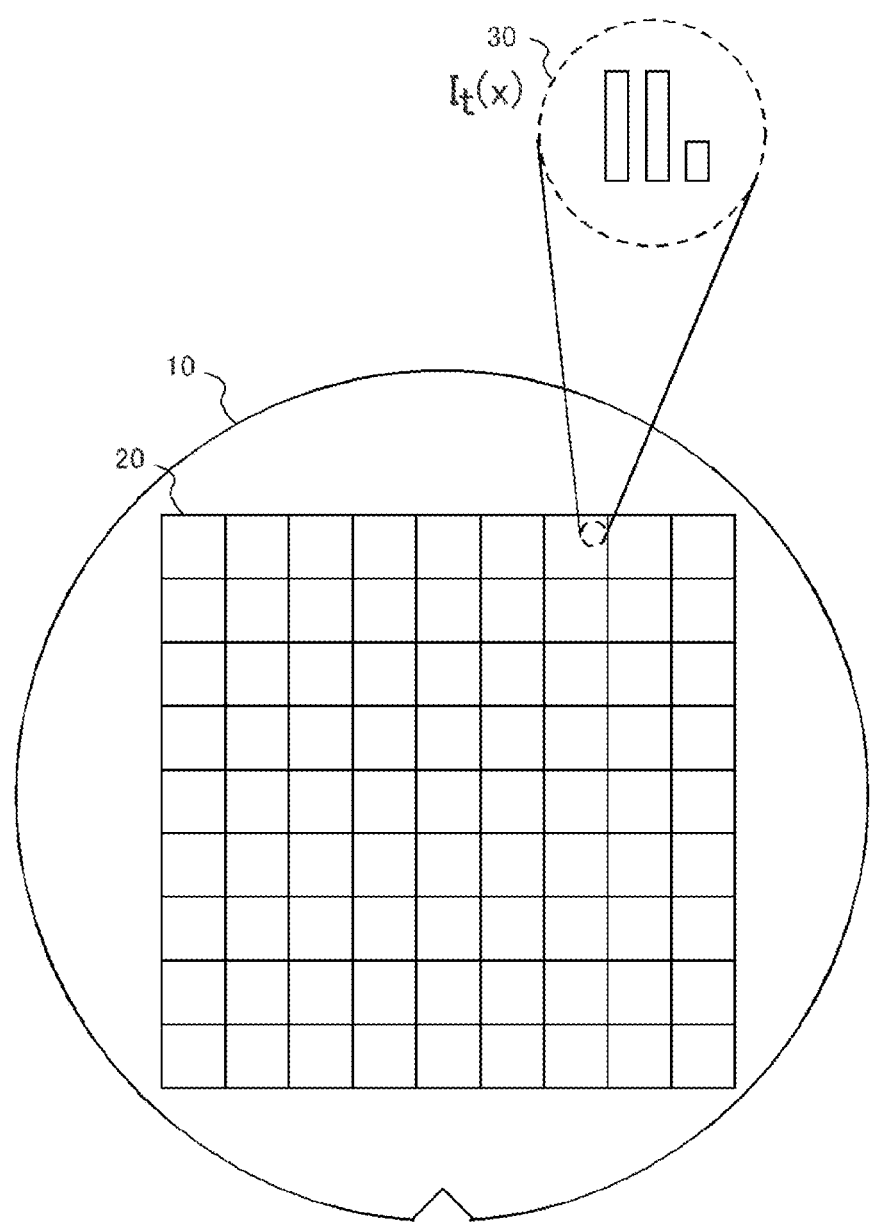
FIG. 5 is a schematic diagram for explaining a target image.

FIG. 5 is a schematic diagram for explaining a target image. In order to form a plurality of dies 20 on the wafer 10, an image to be formed at a position corresponding to the die 20 is a target image $I_t(x)$. Therefore, the target image $I_t(x)$ is a function of a position x on the coordinate axis set in each of the dies 20. In FIG. 5, a part 30 of the target image $I_t(x)$ is schematically illustrated in an enlarged manner. In the present embodiment, the target image $I_t(x)$ is set as an intensity distribution.

In the flowchart of FIG. 4, a formed image using the spatial light modulation element 110 is set (S103). That is, a state of each of the micromirrors 114 of the spatial light modulation element 110 is represented by $\xi_i$, and a formed image obtained by imaging the reflected light of the light illuminated on the spatial light modulation element 110 is formulated. For example, information regarding the spatial light modulation element 110 is received from the user, and the setting unit 210 sets the formed image on the basis of the information.

Figure 6:
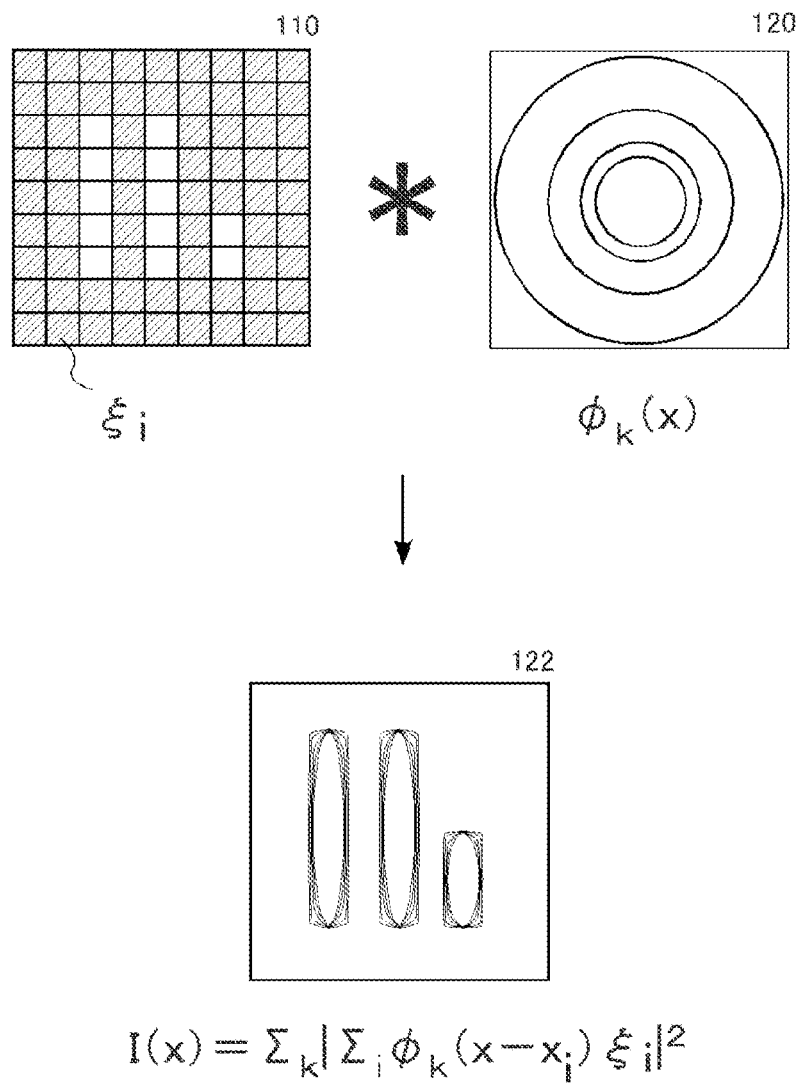
FIG. 6 is a schematic diagram illustrating a relationship between a state of a micromirror of the spatial light modulation element and a formed image.

FIG. 6 is a schematic diagram illustrating a relationship between the state $\xi_i$ of the micromirror 114 of the spatial light modulation element 110 and a formed image 122. As illustrated in FIG. 6, the formed image I(x) is represented by a convolution integral of a state $\xi_i$ of each of a plurality of pixels of the spatial light modulation element 110 and a point spread function 120 (that is, a single pixel image) of one pixel.

If a k-th kernel of the transmission cross coefficient of the point spread function 120 is expressed as $\varphi_k(x)$, the formed image I(x) is formulated as the following Expression 1.

$$I(x) = \sum_k \left| \sum_{ij} \phi_k(x - x_i)\xi_i \right|^2 \quad \text{[Expression 1]}$$

Considering even higher order kernels correspond to using single pixel images corresponding to a plurality of coherent modes by partial coherent imaging. As a result, the formed image I(x) is also formulated as the intensity distribution in response to the target image $I_t(x)$ being expressed as the intensity distribution in Step S101. Note that the kernel information is stored in the storage unit 212 in advance.

When Expression 1 is developed and organized, it can be expressed as the following Expression 2.

$$I(x) = \sum_{ij} K_{ij}(x)\xi_i\xi_j \quad \text{[Expression 2]}$$

In the flowchart of FIG. 4, an evaluation function is set (S105). Here, an evaluation function H for evaluating the degree of coincidence is set in order to form the target image $I_t(x)$ set in Step S101 by the formed image I(x) formulated in Step S103. As an example of the evaluation function H, in the present embodiment, the setting unit 210 sets the sum of squares of the difference expressed in the following Expression 3.

$$H = \int \left| I_t(x) - \sum_{ij} K_{ij}(x)\xi_i\xi_j \right|^2 dx \quad \text{[Expression 3]}$$

When the integration with respect to x is performed, the evaluation function H becomes a function of at most a fourth order having $\xi_n$ (n is i or j) as a variable. Here, $\xi_n$ is either a binary value of 0 or 1.

From this, the inventor of the present application has found that the problem of finding a combination of $\xi_n$ that minimizes the evaluation function H results in a problem of finding a combination of the states of bits when the minimum value of the energy corresponding to the evaluation function H, that is, the ground state, of the physical system including a plurality of bits that can take either of two states is taken. As an example of a physical system including a plurality of bits that can take either of two states, there is an Ising model.

Figure 7:
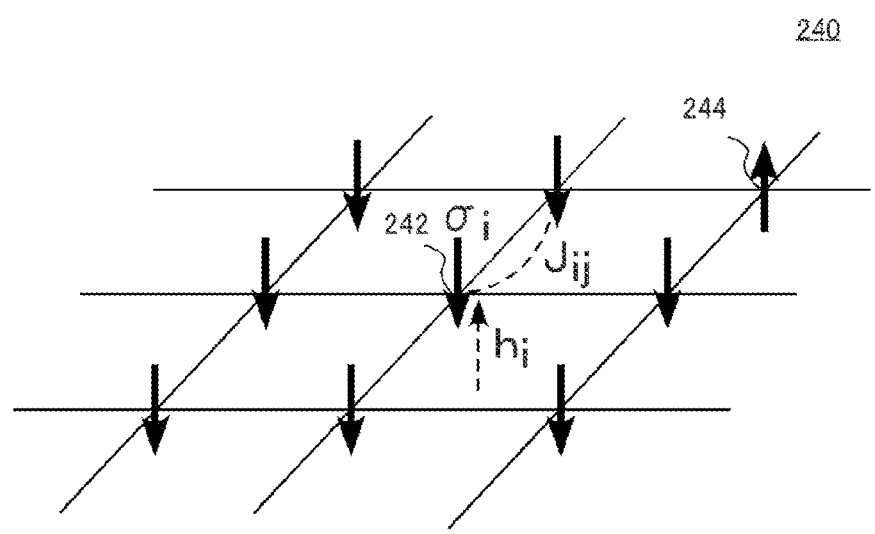
FIG. 7 is a schematic diagram of an Ising model.

FIG. 7 is a schematic diagram of an Ising model 240. In a broad sense, the Ising model 240 is a set of a plurality of bits disposed discretely that can take any of two quantized states. A hardware example of the Ising model 240 is a plurality of magnetic elements disposed at each point of a lattice shape and capable of taking either a spin state $\sigma_i$ of +1 or −1. The i-th magnetic element and the j-th magnetic element interact with each other with a coupling constant $J_{ij}$. There may also be interactions between non-adjacent magnetic elements. In addition, an external magnetic field h, acts on the i-th magnetic element.

In FIG. 7, nine bits 242 and 244 are drawn corresponding to the nine micromirrors 114 and 116 of the spatial light modulation element 110 of FIG. 2. Further, a state in which the bit 242 is in the spin state "−1" is illustrated corresponding to the fact that the micromirror 114 is in the first state "1". Similarly, a state in which the bit 244 is in the spin state "+1" is illustrated corresponding to the fact that the micromirror 116 is in the second state "0".

Here, variable conversion can be performed from the state $\xi_i$ to the state $\sigma_i$ with $\sigma_i = 1 - 2\xi_i$. Therefore, it can be said that the evaluation function H of above Expression 3 is equivalent to the evaluation function H of the following Expression 4.

$$H = \int \left| I_t(x) - \sum_{ij} K'_{ij}(x)\sigma_i\sigma_j - \sum_i k_i(x)\sigma_i \right|^2 dx \quad \text{[Expression 4]}$$

It can also be said that the evaluation function H is a Hamiltonian in the Ising model. Since the variable conversion is linear, the evaluation function H of the following Expression 4 is also a function of $\sigma_i$ of at most a fourth order. As a result, the evaluation function H in which the first state and the second state in the plurality of pixels of the spatial light modulation element 110 correspond to up ($\sigma_i=+1$) or down ($\sigma_i=−1$) of the plurality of spins of the Ising model is set.

The Ising model 240 deals with interactions up to the second order in many cases. Therefore, in a case where the evaluation function H has a term corresponding to a third-order or higher-order interaction as in the above Expression 4 (S107: Yes), the evaluation function H is corrected to be at most a second order using the auxiliary bit (S109).

Specifically, the term $\sigma_i\sigma_j$ of the second-order interaction is represented using the auxiliary bit $\sigma_{ij}$. Here, since the term $\sigma_i\sigma_j$ of the second-order interaction includes an element related to a logical product, once $\sigma_i$ is converted into $q_i$ having a value of either 0 or 1 as in the following Expression 5, and a truth value thereof is considered.

$$\sigma_i\sigma_j = (1 - 2q_i)(1 - 2q_j) \quad \text{[Expression 5]}$$
$$= 1 - 2q_i - 2q_j + 4q_iq_j$$
$$= 1 - 2q_i - 2q_j + 4q_{ij}$$
$$= 1 + \sigma_i + \sigma_j - 2\sigma_{ij}$$

The following Table I is a truth value table of $q_i$, $q_j$ and auxiliary bits $q_{ij}$.

TABLE 1

| | $q_i$ | $q_j$ | $q_{ij}$ | $H_{ij}$ |
|---|---|---|---|---|
| LOGICAL PRODUCT | 0 | 0 | 0 | 0 |
| | 0 | 1 | 0 | 0 |

TABLE 1-continued

|  | $q_i$ | $q_j$ | $q_{ij}$ | $H_{ij}$ |
|---|---|---|---|---|
|  | 1 | 0 | 0 | 0 |
|  | 1 | 1 | 1 | 0 |
| NOT LOGICAL PRODUCT | 0 | 0 | 1 | 3 |
|  | 0 | 1 | 1 | 1 |
|  | 1 | 0 | 1 | 1 |
|  | 1 | 1 | 0 | 1 |

Since the auxiliary bit $q_{ij}$ is $q_i q_j$, it is preferable that the auxiliary bit $q_{ij}$ is a logical product of $q_i$ and $q_j$. Therefore, in a case where the logical product is obtained, the value is not changed (that is, zero), and in a case where the logical product is not obtained, the function $H_{ij}$ whose value increases is added to the evaluation function H of the above Expression 4. An example of such $H_{ij}$ is the following Expression 6.

$$H_{ij} = 3q_{12} + q_1 q_2 - 2q_{12}q_1 - 2q_{12}q_2 \qquad \text{[Expression 6]}$$
$$= \sigma_i + \sigma_j - 2\sigma_{ij} + \sigma_i \sigma_j - 2\sigma_i \sigma_{ij} - 2\sigma_j \sigma_{ij}$$

Using the auxiliary bit and the function determined in this manner, the evaluation function H is corrected to the following Expression 7.

$$H = \int \left| I_t(x) - \sum_{ij} K'_{ij}(x)(1 + \sigma_i + \sigma_j - 2\sigma_{ij}) - \sum_i k_i(x)\sigma_i \right|^2 dx + B \sum_{ij} H_{ij} \qquad \text{[Expression 7]}$$

This can reduce the possibility that a solution corresponding to a combination of $q_i$, $q_j$, and $q_{ij}$ that does not become a logical product is selected. Here, B is a constant. The constant B may be defined on the basis of the value of $K'_{ij}$, for example, preferably greater than the maximum value of $K'_{ij}$ (for example, 10 times).

When the above Expression 7 is developed to be integrated and organized with respect to x, the evaluation function H is expressed as the following Expression 8. Here, i' indicates i or ij, and similarly, j' indicates j or ij. In this case, the setting unit 210 performs integration of x by, for example, reading a library of integral calculations stored in advance in the storage unit 212.

$$H = -\sum_{i'j'} J_{i'j'} \sigma_{i'} \sigma_{j'} - \sum_{i'} h_{i'} \sigma_{i'} \qquad \text{[Expression 8]}$$

This corresponds to calculation of each coefficient of the Hamiltonian in the Ising model (S111). More specifically, a physical quantity Ji'j' corresponding to the coupling constant between the plurality of spins and the physical quantity $h_i$ corresponding to the external field acting on each spin are calculated on the basis of a coherence between the plurality of pixel images in the imaging and the target image. In Expression 8, the constant term that does not depend on $\sigma'_i$ does not affect the subsequent calculation, and thus is omitted.

The determination unit 220 evaluates the evaluation function H expressed by the above Expression 8 by the Ising machine 230 (S113). More specifically, the Ising machine 230 calculates a ground state in which the energy corresponding to the evaluation function H is a minimum value in the Ising model (S113). In the present embodiment, a computer specialized for quantum annealing is used as the Ising machine 230. In a computer specialized for quantum annealing, calculation is executed by actually expressing a state transition from an initial state to a ground state in the computer as a physical phenomenon supported by quantum mechanics.

In the quantum annealing, the state of each spin of the Ising model is initially set to an equivalent superposition state of spin +1 and spin −1, which is the eigenstate of a transverse magnetic field term. Thereafter, as the transverse magnetic field term is gradually reduced and the influence of the coupling constant Ji'j' and the external field $h_{i'}$ is relatively increased, each spin constituting the ground state of the Hamiltonian (that is, the evaluation function H) of the Ising model approaches either state of +1 or −1. Finally, when the transverse magnetic field term is set to zero, the ground state is selected.

However, the ground state may not be finally selected in quantum annealing. The reason why the ground state is not selected may be that the state falls into a local minimum (that is not the global minimum), thermal noise or interaction with the surrounding environment can not be completely blocked, or the like. Therefore, calculation by quantum annealing may be performed a plurality of times to adopt a majority decision, or a minimum value may be selected from a plurality of calculation results.

The determination unit 220 determines the state of each pixel of the spatial light modulation element 110 on the basis of the calculation result of the Ising machine 230, and outputs the state to the control unit 130 (S115). That is, the determination unit 220 determines whether each of the plurality of pixels is to be in the first state or the second state on the basis of the values of the plurality of bits included in the calculation result.

In this case, the spin state $\sigma_i$ of the i-th bit in the calculation result in the Ising model 240 is allocated to the state $\xi_i$ of the i-th pixel of the spatial light modulation element 110 from the relationship of $\sigma_i = 1 - 2\xi_i$. That is, the spin state $\sigma_i = -1$ of the bit is assigned to the first state $\xi_i = 1$ of the pixel, and the spin state $\sigma_i = +1$ of the bit is assigned to the second state $\xi_i = 0$ of the pixel.

As described above, according to the present embodiment, the state of each pixel of the spatial light modulation element 110 for forming the formed image close to the target image can be calculated more quickly. Although it is theoretically conceivable to exhaustively calculate the evaluation function H represented by the above Expression 4 for every possible combination of the states y, as the number of pixels increases, the calculation cannot be completed in a realistic amount of time. On the other hand, according to the method of the present embodiment, since the energy in the Ising model is calculated by the Ising machine, the calculation can be performed in a sufficiently realistic amount of time even if the number of pixels is large.

[Modification of First Embodiment]

Figure 8:
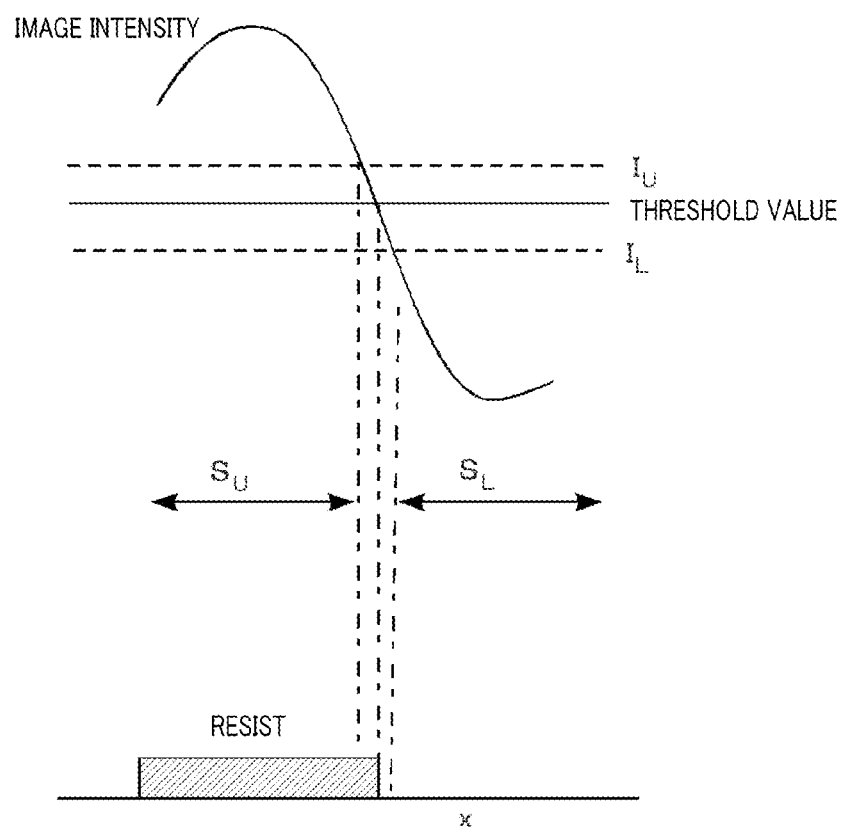
FIG. 8 is a conceptual diagram for explaining a modification of a first embodiment.

FIG. 8 is a conceptual diagram for explaining a modification of the first embodiment. In the first embodiment, the formed image is represented by a continuous value, but the formed image may be represented as an image intensity to such an extent that resist remains after exposure and development and an image intensity to such an extent that resist does not remain.

As illustrated in FIG. 8, a negative resist is assumed, and upper and lower margins with respect to a threshold value of image intensity of whether a resist remains are $I_U$ and $I_L$, respectively. In this case, in a case where the position x belongs to a region $S_U$ where the resist is left, it is required to satisfy $I_U \leq I(x)$. On the other hand, in a case where the position x belongs to a region $S_L$ where the resist is not left, it is required to satisfy $I_L \geq I(x)$.

Here, if a slack variable $Y(x)$ (<0), is introduced so that the inequality can be treated as an equation, it can be expressed as the following Expression 9. $Y(x)$ is as defined in Expression 10.

$$x \in S_U \quad I_U(x) \leq I(x) \rightarrow I(x) - Y(x) = I_U(x) \quad \text{[Expression 9]}$$
$$x \in S_L \quad I_L(x) \geq I(x) \rightarrow I(x) + Y(x) = I_L(x)$$

$$Y(x) = b \sum_{n=0}^{N-1} 2^n \frac{1 + \eta(x, n)}{2} \quad \text{[Expression 10]}$$

Here, q(x, n) is ±1, and is an auxiliary bit that determines the value of the slack variable. This auxiliary bit can be determined regardless of the state of the pixel, that is, independently of the state of the pixel. Note that $0 \leq Y(x) \leq 2^N b$, and a possible value can be adjusted by b and N.

By using the $Y(x)$, the formed image $I(x)$ can be expressed as an image intensity to such an extent that resist remains after exposure and development and an image intensity to such an extent that resist does not remain. Therefore, if $\pm Y(x)$ is collectively expressed by $Y(x)$, the evaluation function H can be expressed by the following Expression 11 corresponding to Expression 7 of the first embodiment.

$$H = \int \left| I_t(x) - \sum_{ij} K_{ij}(x)(1 + \sigma_i + \sigma_j - 2\sigma_{ij}) - \sum_i k_i(x)\sigma_i - Y(x) \right|^2 dx + B \sum_{ij} H_{ij} \quad \text{[Expression 11]}$$

When Expression 11 is discretized with respect to x, the following Expression 12 is obtained.

$$H = \sum_k \left| I_t(x_k) - \sum_{ij} K_{ij}(x_k)(1 + \sigma_i + \sigma_j - 2\sigma_{ij}) - \sum_i k_i(x_k)\sigma_i - Y(x_k) \right|^2 + B \sum_{ij} H_{ij} \quad \text{[Expression 12]}$$

Further, the sum of k in the above Expression 12 is taken, and the coefficients are collected to obtain the following Expression 13. Here, the variables $\sigma_i$, $\sigma_{ij}$, and $\eta(x_k, n)$ are collectively referred to as $s_i$.

$$H = -\sum_{ij} j_{ij} s_i s_j - \sum_i h_i s_i \quad \text{[Expression 13]}$$

By evaluating the evaluation function H of Expression 13 in the same manner as in the first embodiment, it is possible to determine the state of each pixel corresponding to the image intensity at which the resist remains and the image intensity at which the resist does not remain. Although the negative resist is taken as an example, the present invention can be similarly applied to a positive resist.

Second Embodiment

The second embodiment is different from the first embodiment in that the target image $I_t(x)$ is expressed as an amplitude distribution in Step S101 of FIG. 4, and correspondingly, a formed image $V(x)$ is formulated as an amplitude distribution in Step S102. This corresponds to considering only a primary kernel (e(x)) of the point spread function 120 and corresponds to approximating as a complete coherent imaging. The formed image $V(x)$ is formulated as in the following Expression 14.

$$V(x) = \sum_i \phi(x - x_i)\xi_i \quad \text{[Expression 14]}$$

In Step S105, the evaluation function H can be set as the following Expression 15. Also in the present embodiment, the sum of squares of the difference is set as an example of the evaluation function H.

$$H = \int \left| V_t(x) - \sum_i \phi(x - x_i)\xi_i \right|^2 dx \quad \text{[Expression 15]}$$

The above Expression 15 becomes a function of at most a second order having $\xi_n$ (n is i or j) as a variable when the integration with respect to x is performed. That is, in the case of corresponding to the Ising model, the interaction is a second-order interaction at most (S107: No). Therefore, it is not necessary to lower the order using the auxiliary bit in Step S109.

When the above Expression 15 is developed to be integrated and organized with respect to x (S111), and replaced with the Ising model, the evaluation function H is expressed as the following Expression 16. Here, similarly to the first embodiment, the variable conversion is performed such that the state $\xi_i$ of each pixel of the spatial light modulation element 110 is converted to the state $\sigma_i$ ($\sigma_i = 1 - 2\xi_i$) of the spin of the Ising model.

$$H = -\sum_{ij} J_{ij} \sigma_i \sigma_j - \sum_i h_i \sigma_i \quad \text{[Expression 16]}$$

As a result, a physical quantity $J_{ij}$ corresponding to the coupling constant between the plurality of spins and the physical quantity h, corresponding to the external field acting on each spin are calculated on the basis of a coherence between the plurality of pixel images in the imaging and the target image. In Expression 14, the constant term that does not depend on $\sigma_i$ does not affect the subsequent calculation, and thus is omitted. Further, the state of each pixel of the spatial light modulation element 110 is determined by executing Steps S113 and S115 described above.

Also in the second embodiment, the state of each pixel of the spatial light modulation element 110 for forming the formed image close to the target image can be calculated more quickly. Further, since the target image and the formed image are expressed by the amplitude distribution, there is an advantage that the interaction of the Ising model in the evaluation function H is at most a second order, and it is not necessary to use an auxiliary bit for lowering the order.

Third Embodiment

Figure 9:
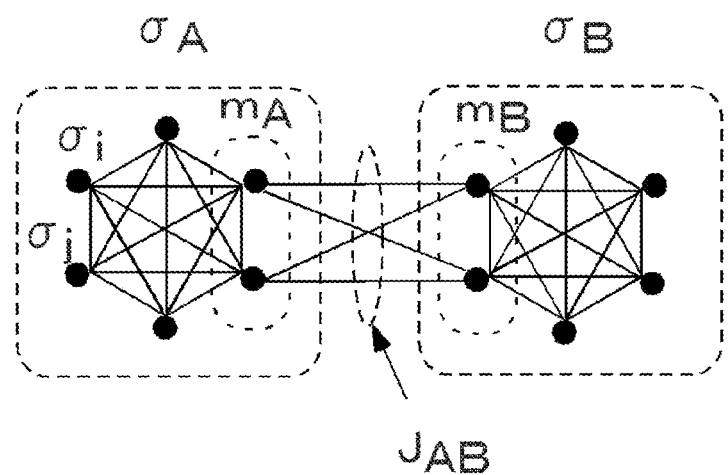
FIG. 9 is a schematic diagram for explaining a third embodiment.

FIG. 9 is a schematic diagram for explaining a third embodiment. The third embodiment is different from the first embodiment in that one bit is represented spuriously using a plurality of bits of an Ising model.

In a case where the evaluation function H is evaluated by an Ising machine, the number of gradations of the physical quantity $J_{ij}$ assumed as the coupling constant that can be set in the Ising machine and the physical quantity h, corresponding to the external field may be small. In order to simplify the description, it is assumed that it is desired to express the following Expression 17 and Expression 18 by an example of 2 bits. That is, consider a case where it is desired to express $J_{ab}$ in (2 L+1) gradation.

$$H = -J_{ab}\sigma_a\sigma_b \quad \text{[Expression 17]}$$

$$J_{ab} \in [-L, -L+1, \ldots, L-1, L] \quad \text{[Expression 18]}$$

However, there is a problem that the Ising machine can express only (2K+1) gradation (where. K<<L) as in the following Expression 19.

$$J_{ij} \in [-K, -K+1, \ldots, K] K<<L \quad \text{[Expression 19]}$$

In this case, as illustrated in FIG. 9, a plurality of bits $\sigma_i$, $\sigma_j$, ... (also referred to as configuration bits) are connected to substantially function as one logical bit $\sigma_A$. In FIG. 9, as an example, six configuration bits are caused to function as one logical bit. Further, the coupling constants of the configuration bits included in the different logical bits $\sigma_A$ and $\sigma_B$ are used to represent a coupling constant $J_{AB}$ among the logical bits.

In order to cause the plurality of configuration bits $\sigma_i$, $\sigma_j$, ..., and so on to function as one logical bit $\sigma_A$, it is preferable that the configuration bits $\sigma_i$, $\sigma_j$, ..., and so on included in the same logical bit $\sigma_A$ always have the same value. In order to ensure this, all the coupling constants J among the configuration bits represented by the following Expression 20 are set to be larger than the other coupling constants.

$$H = -J\sum_{i<j}\sigma_i\sigma_j \quad \text{[Expression 20]}$$

According to the above Expression 20, the energy $\Delta E_N$ that increases in a case where one configuration bit is inverted becomes 2(N−1)J, and it becomes difficult to select the energy $\Delta E_N$ as a solution.

Here, if $m_A$ configuration bits of the logical bits $\sigma_A$ and $m_B$ configuration bits of the logical bits $\sigma_B$ are set to interact with each other, that is, to have a non-zero coupling constant $J_{ij}$, the coupling relationship can be set to $m_A \times m_B$ at the maximum. In FIG. 9, an example of $m_A = m_B = 2$ is illustrated. Therefore, if the individual coupling constant $J_{ij}$ can be selected from an integer of (2K+1), one can be selected from an integer of $(2m_A m_B K+1)$ as the whole of the coupling relationship. That is, in a case where it is viewed as a coupling relationship between logical bits, this corresponds to that gradation is increased to $(2m_A m_B K+1)$.

When the above is formulated, the above Expression 17 desired to be expressed can be expressed using the following Expression 21 and Expression 22. Note that the first term and the second term in Expression 21 correspond to the constraint term in Expression 20 above.

$$H = -J\sum_{(i,j)\in A}\sigma_i\sigma_j - J\sum_{(i,j)\in B}\sigma_i\sigma_j - H' \quad \text{[Expression 21]}$$

$$H' = -\sum_{i\in A, j\in B} J_{ij}\sigma_i\sigma_j \quad \text{[Expression 22]}$$

Here, if the expression of the following Expression 23 is used assuming that the constraint is satisfied, Expression 22 can be expressed as the following Expression 24. This corresponds to an Ising model based on an interaction between two bits $\sigma_A$ and $\sigma_B$ in which the coupling constant $J_{AB}$ of $(2m_A m_B K+1)$ gradation can be set.

$$\sigma_{i\in A} = \sigma_A \quad \text{[Expression 23]}$$

$$\sigma_{i\in B} = \sigma_B$$

$$H' = -\left(\sum_{i\in A, j\in B} J_{ij}\right)\sigma_A\sigma_B \quad \text{[Expression 24]}$$

$$= -J_{AB}\sigma_A\sigma_B$$

In Step S111 of FIG. 4, the evaluation function H of the pixel is replaced with the evaluation function H using the logical bit of the Ising model using the above Expression 24. As a result, the evaluation using the configuration bit in the Ising machine can be evaluated as the value of the logical bit, and the calculation can be performed at a high gradation.

Although two logical bits have been described for simplification of description, three or more logical bits may also substantially increase the gradation. Further, although the coupling coefficient has been described, the gradation can be similarly increased for the external field. In addition, the third embodiment can be applied not only to the first embodiment but also to modifications and the second embodiments thereof.

Fourth Embodiment

Figure 10:
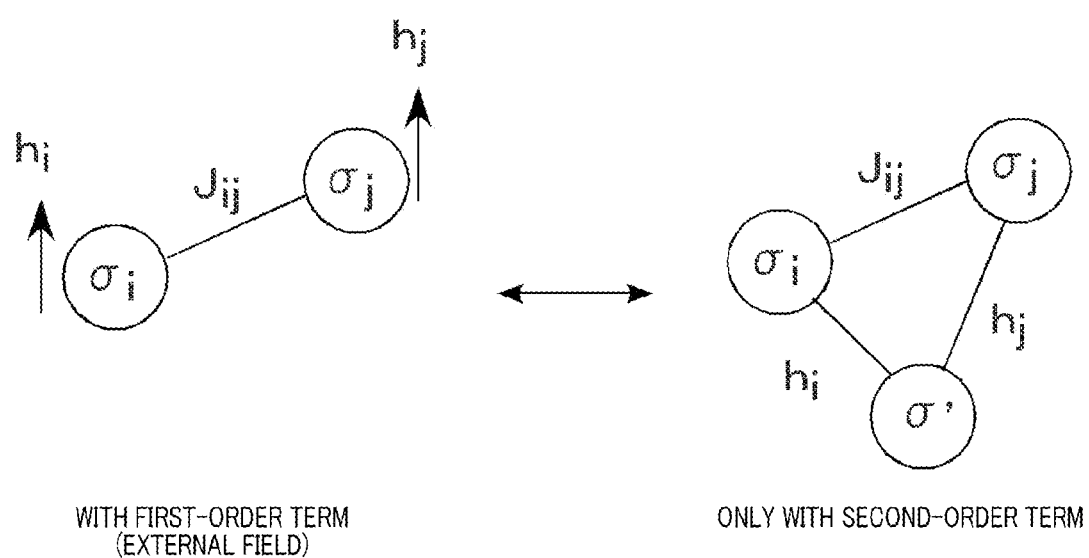
FIG. 10 is a schematic diagram for explaining a fourth embodiment.

FIG. 10 is a schematic diagram for explaining a fourth embodiment. The fourth embodiment is different from the first embodiment in that an auxiliary bit is introduced into a first-order term of the evaluation function H, that is, a term of the external field.

Some Ising machines cannot calculate a first-order term. Therefore, an auxiliary bit is introduced to virtually calculate the first-order term.

For example, the evaluation function H of Expression 13 is considered. The second term of Expression 13 corresponds to a first-order term, that is, the interaction with the external field. One auxiliary bit $\sigma'$ is introduced into the second term to be quadratic as in the following Expression 25.

$$H = -\sum_{ij} J_{ij}\sigma_i\sigma_j - \sum_i h_i\sigma_i\sigma' \qquad \text{[Expression 25]}$$

The above Expression 25 is evaluated in Step S113 of FIG. 4. This corresponds to replacing the effect of the external field on the bit a, with the coupling relationship with the auxiliary bit σ' as illustrated in FIG. 10. In this case, it is equivalent to the original system only when the value of the auxiliary bit σ' is +1. Therefore, among the calculation results by the Ising machine, only the solution satisfying σ'=+1 is adopted.

As described above, according to the fourth embodiment, the evaluation function H including the first-order term can be evaluated by calculation of only the second-order term by the Ising machine that cannot calculate the first-order term. In addition, the fourth embodiment can be applied not only to the first embodiment but also to modifications, the second embodiment, and the third embodiment thereof.

Fifth Embodiment

A fifth embodiment is different from the first embodiment in that each pixel 114 of the spatial light modulation element 110 has multiple values, that is, can take any of three or more states. That is, in the fifth embodiment, each pixel 114 has a state in which the incident light is not reflected toward the second optical system 150 and a plurality of states in which the incident light is reflected at different intensities.

In this case, the state of the i-th pixel can be expressed as the following Expression 26 using $\xi_{i(m)}$, (where, m=0, 1, 2, . . . ) which takes a binary value.

$$\xi_i = \sum_m 2^m \xi_{i(m)} = \xi_{i(0)} + 2\xi_{i(1)} + 2^2\xi_{i(2)} + \ldots \qquad \text{[Expression 26]}$$

In Step S103 of FIG. 4, the formed image I(x) is represented $\xi_{i(m)}$ instead of $\xi_i$ using the above Expression 26. Thus, when the evaluation function H is set in Step S105, an expression of at most the fourth order having $\xi_{n(m)}$ (where, n is i or j) is obtained. Therefore, if the state $\sigma_{i'}$ (where, i' is any of m=0, 1, 2, . . . belonging to i) of each bit of the Ising model is made to correspond to $\xi_{i(m)}$, the evaluation function H represented by the Ising model also becomes an expression of at most the fourth order having $\sigma_{n'}$ (where, n¹ is i' or j').

Therefore, after Step S105, the state of each bit $\sigma_{i'}$ corresponding to the ground state can be obtained by performing calculation similarly to the first embodiment. By converting the state of each bit $\sigma_{i'}$ corresponding to the ground state into the value of each $\xi_{i(m)}$, it is determined which state $\xi_i$ the multi-valued i-th pixel is to be in using the above Expression 26.

As described above, according to the fifth embodiment, even when each pixel 114 of the spatial light modulation element 110 has multiple values, it is possible to determine which value each pixel 114 is to be set in order to forma target image. In addition, the fifth embodiment can be applied not only to the first embodiment but also to modifications, the second embodiment, and the third embodiment thereof.

Other Modifications

Figure 11:
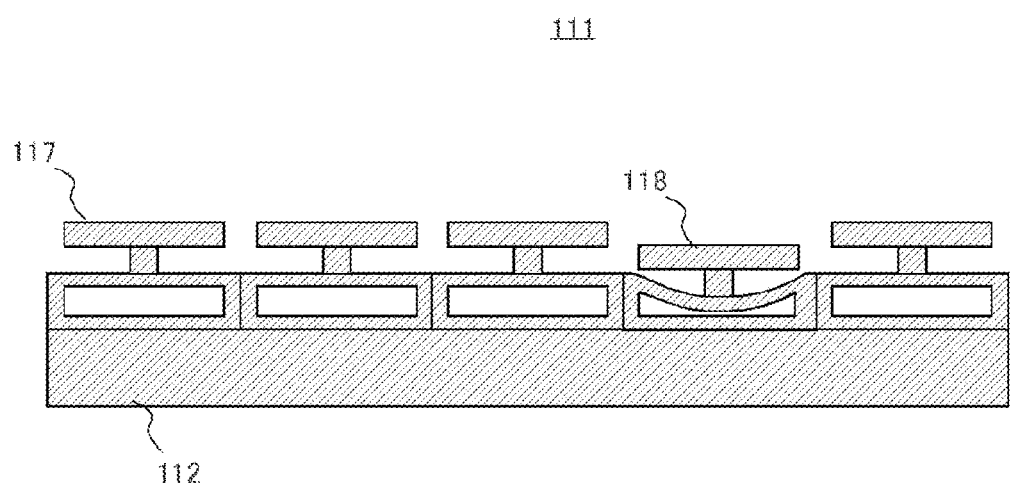
FIG. 11 schematically illustrates another reflective spatial light modulation element 111.

FIG. 1I schematically illustrates another reflective spatial light modulation element 111. The spatial light modulation element 111 includes a plurality of micromirrors 117 and 118 arranged at spatially different positions on the substrate 12. The plurality of micromirrors 117 and 118 are arranged in a lattice shape in the plane direction of the substrate 112. In FIG. 11, for the sake of explanation, five micromirrors in one row are illustrated as viewed from the side, but the number of micromirrors may be about the same as that of the spatial light modulation elements 110.

Each of the plurality of micromirrors 117 and 118 independently moves in parallel with the main surface of the substrate 112 under the control of the control unit 130, and can take either the first state or the second state. The first state (the micromirror 117 in the drawing) is a state of being at a first distance from the substrate 112. On the other hand, the second state (the micromirror 118 in the drawing) is a state of being at a second distance closer than the first distance from the substrate 12. The difference in distance from the substrate 12 in the first state and the second state is ¼ of the wavelength of light used for exposure or a value obtained by adding an integral multiple of a half wavelength thereto. As a result, the second state becomes a state in which the sign of the electric field amplitude is inverted with respect to the first state. Therefore, the first state is represented as $\xi_i=+1$, and the second state is represented as $\xi_i=-1$.

In the case of the spatial light modulation element 111, the spatial light modulation element 110 performs the identity conversion ($\xi_i=\sigma_i$) instead of performing the variable conversion from the pixel state $\xi_i$ to the spin state $\sigma_i$ of the Ising model by the conversion formula $\sigma_i=1-2\xi_i$ in Step S105. As a result, similarly to the case of the spatial light modulation element 110, the state of each pixel of the spatial light modulation element 111 can be determined using the first to fifth embodiments.

Figure 12:
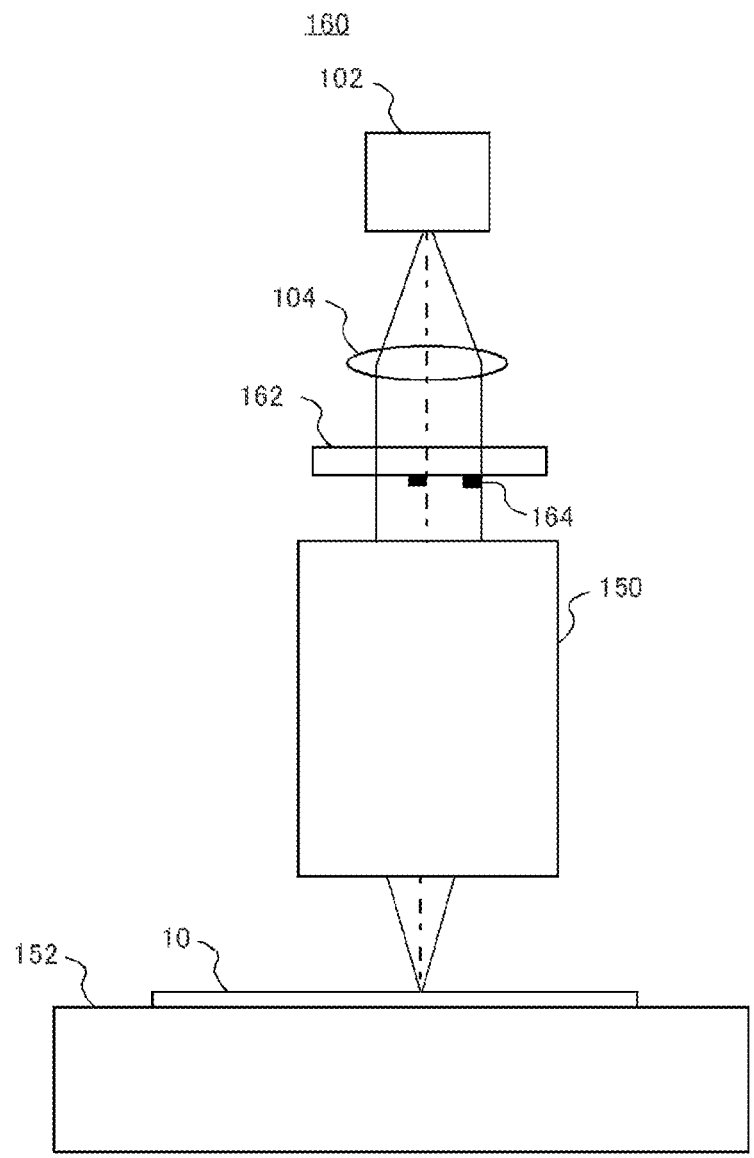
FIG. 12 is a schematic diagram illustrating another modification of the first to fifth embodiments.

FIG. 12 is a schematic diagram illustrating another modification of the first to fifth embodiments. In the first to fifth embodiments, the state of each pixel 114 of the reflective spatial light modulation element 110 illustrated in FIG. 2 is made to correspond to the state of each spin of the Ising model.

Alternatively, the first to fifth embodiments may be applied to the design of a mask 162 of the exposure device 160 using the mask 162 illustrated in FIG. 12. In this case, the mask 162 is virtually divided into minute regions and considered. Each minute region in this case is regarded as a pixel. For a plurality of virtual pixels, a pixel provided with a light shielding portion 164 that shields light from the light source and a pixel that transmits light as transmitted light without being provided with the light shielding portion 164 are made to correspond to the spin state of the Ising model. As a result, the state of each pixel of the mask 162, that is, the state in which the light shielding portion 164 is provided and the state in which the light shielding portion is not provided can be determined on the basis of the value of each spin of the ground state of the Ising model.

Further, the first to fifth embodiments may be applied to a phase difference mask using a phase difference. Similarly, the first to fifth embodiments may be used to determine the state of each pixel in the transmissive spatial light modulation element.

In the first to fifth embodiments, in Step S101 of FIG. 4, an intensity distribution and an amplitude distribution which are target images are given in advance. Alternatively, even in a case where conditions to be satisfied by the target image are indirectly given by an inequality or the like, the first to fifth embodiments can be applied by formulating the target image on the basis of these conditions.

In the first to fifth embodiments, a computer specialized for quantum annealing is used as the Ising machine 230.

However, the Ising machine 230 is not limited thereto, and for example, a computer specialized for simulated annealing may be used. A computer specialized for simulated annealing includes a computer capable of performing simulated annealing at a high speed.

Simulated annealing is a method in which a bit corresponding to a state of each spin of an Ising model is represented on a classical computer, and an optimal solution is searched in a classical stochastic process representing thermal fluctuation. In this case, $J_{ij}$ is a coefficient to be multiplied by a product between a plurality of bits, and h, is an amount corresponding to a coefficient to be multiplied by each bit.

Although the determination device 200 of FIG. 2 above is integrated in the exposure device 100, the determination device 200 may be a separate device from the exposure device 100. Further, although the Ising machine 230 is integrated in the determination device 200 in FIG. 2, the Ising machine 230 may be a separate device from the determination device 200. In addition, at least a part of the flowchart of FIG. 4 may be formulated and calculated by the determination device 200 by the user.

Various embodiments of the present invention may also be described with reference to flowcharts and block diagrams, where the blocks may represent (1) a stage of processing in which an operation is performed or (2) a section of a device that is responsible for performing the operation. Certain stages and sections may be implemented by dedicated circuitry, programmable circuitry provided with computer readable instructions stored on a computer readable medium, and/or a processor provided with computer readable instructions stored on a computer readable medium. The dedicated circuitry may include digital and/or analog hardware circuits, and may include integrated circuits (ICs) and/or discrete circuits. The programmable circuitry may include reconfigurable hardware circuits including memory elements such as logic AND, logic OR, logic XOR, logic NAND, logic NOR, and other logic operations, flip-flops, registers, field programmable gate arrays (FPGA), programmable logic arrays (PLA), and the like.

The computer readable medium may include any tangible device capable of storing instructions for execution by a suitable device, so that the computer readable medium having the instructions stored therein will have a product including instructions that can be executed to create means for performing the operations specified in flowcharts or block diagrams. Examples of the computer readable medium may include an electronic storage medium, a magnetic storage medium, an optical storage medium, an electromagnetic storage medium, a semiconductor storage medium, and the like. More specific examples of the computer readable medium may include a floppy (registered trademark) disk, a diskette, a hard disk, a random access memory (RAM), a read-only memory (ROM), an erasable programmable read-only memory (EPROM or flash memory), an electrically erasable programmable read-only memory (EEPROM), a static random access memory (SRAM), a compact disc read-only memory (CD-ROM), a digital versatile disk (DVD), a Blu-ray (registered trademark) disk, a memory stick, an integrated circuit card, and the like.

The computer readable instructions may include source code or object code written in any combination of one or more programming languages, including assembler instructions, instruction-set-architecture (ISA) instructions, machine instructions, machine-dependent instructions, microcode, firmware instructions, state-setting data, or an object oriented programming language such as Smalltalk, JAVA (registered trademark), C++, or the like, and conventional procedural programming languages such as the "C" programming language or similar programming languages.

The computer readable instructions may be provided for a processor or programmable circuitry of a general purpose computer, special purpose computer, or other programmable data processing devices locally or via a wide area network (WAN) such as a local area network (LAN), the Internet, or the like, and execute the computer readable instructions to create means for executing the operations specified in flowcharts or block diagrams. Examples of the processor include a computer processor, a processing unit, a microprocessor, a digital signal processor, a controller, a microcontroller, and the like.

Figure 13:
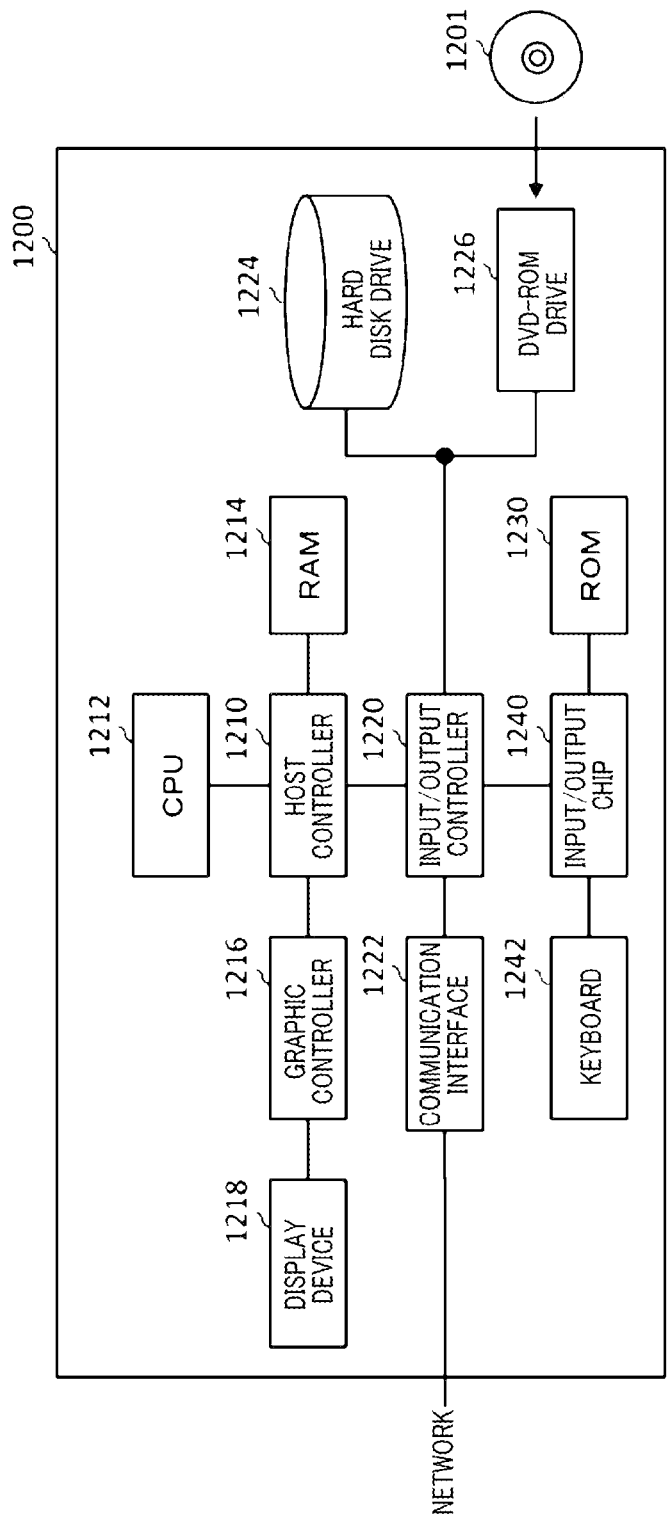
FIG. 13 illustrates an example of a computer 1200 in which a plurality of aspects of the present invention may be embodied in whole or in part.

FIG. 13 illustrates an example of a computer 1200 in which a plurality of aspects of the present invention may be embodied in whole or in part. A program installed in the computer 1200 may cause the computer 1200 to function as an operation associated with the devices according to the embodiments of the present invention or as one or more sections of the devices, or may cause the operation or the one or more sections to be executed, and/or may cause the computer 1200 to execute a process according to the embodiments of the present invention or a stage of the process. Such programs may be executed by a CPU 1212 to cause the computer 1200 to perform certain operations associated with some or all of the blocks in the flowcharts and block diagrams described in the present specification.

The computer 1200 according to the present embodiment includes the CPU 1212, a RAM 1214, a graphic controller 1216, and a display device 1218, which are interconnected by a host controller 1210. The computer 1200 also includes input/output units such as a communication interface 1222, a hard disk drive 1224, a DVD-ROM drive 1226, and an IC card drive, which are connected to the host controller 1210 via an input/output controller 1220. The computer also includes legacy input/output units such as a ROM 1230 and a keyboard 1242, which are connected to the input/output controller 1220 via an input/output chip 1240.

The CPU 1212 operates according to programs stored in the ROM 1230 and the RAM 1214, thereby controlling each unit. The graphics controller 1216 acquires image data generated by the CPU 1212 in a frame buffer or the like provided in the RAM 1214 or in itself, such that the image data is displayed on the display device 1218.

The communication interface 1222 communicates with other electronic devices via a network. The hard disk drive 1224 stores programs and data used by the CPU 1212 in the computer 1200. The DVD-ROM drive 1226 reads a program or data from the DVD-ROM 1201 and provides the program or data to the hard disk drive 1224 via the RAM 1214. The IC card drive reads programs and data from the IC card, and/or writes programs and data to the IC card.

The ROM 1230 stores therein boot programs and the like executed by the computer 1200 at the time of activation, and/or programs that depend on the hardware of the computer 1200. The input/output chip 1240 may also connect various input/output units to the input/output controller 1220 via parallel ports, serial ports, keyboard ports, mouse ports, or the like.

The program is provided by a computer readable medium such as the DVD-ROM 1201 or the IC card. The program is read from a computer readable medium, installed in the hard disk drive 1224, the RAM 1214, or the ROM 1230 which are also examples of the computer readable medium, and executed by the CPU 1212. The information processing described in these programs is read by the computer 1200 and provides cooperation between the programs and various types of hardware resources. The device or method may be configured by implementing operations or processing of information according to use of the computer 1200.

For example, in a case where communication is performed between the computer 1200 and an external device, the CPU 1212 may execute a communication program loaded in the RAM 1214 and instruct the communication interface 1222 to perform communication processing on the basis of a process described in the communication program. Under the control of the CPU 1212, the communication interface 1222 reads transmission data stored in a transmission buffer processing area provided in a recording medium such as the RAM 1214, the hard disk drive 1224, the DVD-ROM 1201, or the IC card, transmits the read transmission data to the network, or writes reception data received from the network in a reception buffer processing area or the like provided on the recording medium.

In addition, the CPU 1212 may cause the RAM 1214 to read all or a necessary part of a file or database stored in an external recording medium such as the hard disk drive 1224, the DVD-ROM drive 1226 (DVD-ROM 1201), the IC card, or the like, and may execute various types of processing on data on the RAM 1214. Next, the CPU 1212 writes back the processed data to the external recording medium.

Various types of information such as various types of programs, data, tables, and databases may be stored in a recording medium and subjected to information processing. The CPU 1212 may execute various types of processing on the data read from the RAM 1214, including various types of operations, information processing, conditional determination, conditional branching, unconditional branching, information retrieval/replacement, and the like, which are described throughout the present disclosure and specified by a command sequence of a program, and writes back the results to the RAM 1214. Further, the CPU 1212 may retrieve information in a file, a database, or the like in the recording medium. For example, in a case where a plurality of entries each having the attribute value of a first attribute associated with the attribute value of a second attribute is stored in the recording medium, the CPU 1212 may retrieve the plurality of entries for an entry matching the condition in which the attribute value of the first attribute is specified, read the attribute value of the second attribute stored in the entry, and thereby acquire the attribute value of the second attribute associated with the first attribute satisfying the predetermined condition.

The programs or software modules described above may be stored in a computer readable medium on or near the computer 1200. In addition, a recording medium such as a hard disk or a RAM provided in a server system connected to a dedicated communication network or the Internet can be used as a computer readable medium, thereby providing a program to the computer 1200 via the network.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A determination method for determining, from a formed image obtained by imaging at least one of reflected light and transmitted light of light irradiated to a spatial light modulation element including a plurality of pixels disposed at spatially different positions from each other, and transmitted light of light irradiated to a mask in which a plurality of minute regions that are virtually divided is regarded as the plurality of pixels, to which one of a plurality of states each of the plurality of pixels is to be set in order to form a target image that is an image satisfying a target condition on an object, the determination method comprising:
causing the state in each of the plurality of pixels to correspond to a plurality of states of a plurality of bits of an Ising model, and setting an evaluation function for evaluating a degree of coincidence between the target image and the formed image as a function of the plurality of bits; and
determining which one of the plurality of states is to be set for each of the plurality of pixels on a basis of states of the plurality of bits included in a result obtained by evaluating the evaluation function by an Ising machine.

2. The determination method according to claim 1, wherein
two possible states of each of the plurality of pixels are a first state in which a first light state occurs and a second state in which a second light state different from the first light state occurs.

3. The determination method according to claim 1, wherein
n possible states of each of the plurality of pixels are a first state to an n-th state in which a first light state to an n-th light state different from each other occur.

4. The determination method according to claim 1, wherein
in the setting, a physical quantity corresponding to a coupling constant between the plurality of bits in quantum annealing and a physical quantity corresponding to an external field acting on each bit are determined on a basis of coherence between a plurality of pixel images in the imaging and a target image, and
in the determining, a computer specialized for the quantum annealing is used as the Ising machine.

5. The determination method according to claim 2, wherein
in the setting, a physical quantity corresponding to a coupling constant between the plurality of bits in quantum annealing and a physical quantity corresponding to an external field acting on each bit are determined on a basis of coherence between a plurality of pixel images in the imaging and a target image, and
in the determining, a computer specialized for the quantum annealing is used as the Ising machine.

6. The determination method according to claim 3, wherein
in the setting, a physical quantity corresponding to a coupling constant between the plurality of bits in quantum annealing and a physical quantity correspond- ing to an external field acting on each bit are determined on a basis of coherence between a plurality of pixel images in the imaging and a target image, and in the determining, a computer specialized for the quantum annealing is used as the Ising machine.

7. The determination method according to claim 1, wherein in the setting, a coefficient to be multiplied by a product between the plurality of bits in simulated annealing and an amount corresponding to a coefficient to be multiplied by each bit are determined on a basis of coherence between a plurality of pixel images in the imaging and a target image, and in the determining, a computer specialized for the simulated annealing is used as the Ising machine.

8. The determination method according to claim 2, wherein in the setting, a coefficient to be multiplied by a product between the plurality of bits in simulated annealing and an amount corresponding to a coefficient to be multiplied by each bit are determined on a basis of coherence between a plurality of pixel images in the imaging and a target image, and in the determining, a computer specialized for the simulated annealing is used as the Ising machine.

9. The determination method according to claim 3, wherein in the setting, a coefficient to be multiplied by a product between the plurality of bits in simulated annealing and an amount corresponding to a coefficient to be multiplied by each bit are determined on a basis of coherence between a plurality of pixel images in the imaging and a target image, and in the determining, a computer specialized for the simulated annealing is used as the Ising machine.

10. The determination method according to claim 1, wherein the evaluation function is set using the target image and a single pixel image expressed by an intensity distribution.

11. The determination method according to claim 10, wherein the evaluation function is set using the target image expressed by an intensity distribution when partially coherent imaging is performed and a single pixel image corresponding to a plurality of coherent modes by the partially coherent imaging.

12. The determination method according to claim 1, wherein the evaluation function is set using the target image and a single pixel image expressed by an amplitude distribution.

13. The determination method according to claim 1, wherein in the setting, an auxiliary bit expressing n-th order interaction of the plurality of bits as (n-k)-th order is used (where, n and k are positive integers, and n>k).

14. The determination method according to claim 1, wherein the evaluation function is also a function of a plurality of bits that can be selected regardless of states of the plurality of pixels.

15. A determination device for determining, from a formed image obtained by imaging at least one of reflected light and transmitted light of light irradiated to a spatial light modulation element including a plurality of pixels disposed at spatially different positions from each other, and transmitted light of light irradiated to a mask in which a plurality of minute regions that are virtually divided is regarded as the plurality of pixels, to which one of a plurality of states each of the plurality of pixels is to be set in order to form a target image that is an image satisfying a target condition on an object, the determination device comprising:

at least one processor;

a setting unit configured to cause, using the at least one processor, the state in each of the plurality of pixels to correspond to a plurality of states of a plurality of bits of an Ising model, and set an evaluation function for evaluating a degree of coincidence between the target image and the formed image as a function of the plurality of bits; and a determination unit configured to determine, using the at least one processor, which one of the plurality of states is to be set for each of the plurality of pixels on a basis of states of the plurality of bits included in a result obtained by evaluating the evaluation function by an Ising machine.

16. An exposure device comprising:

the determination device according to claim 15; and a control unit configured to control, using the at least one processor, each of the plurality of pixels of the spatial light modulation element to a determined state.

17. A non-transitory computer readable medium having recorded thereon a program to cause a computer to determine, from a formed image obtained by imaging at least one of reflected light and transmitted light of light irradiated to a spatial light modulation element including a plurality of pixels disposed at spatially different positions from each other, and transmitted light of light irradiated to a mask in which a plurality of minute regions that are virtually divided is regarded as the plurality of pixels, to which one of a plurality of states each of the plurality of pixels is to be set in order to form a target image that is an image satisfying a target condition on an object, the computer is configured to execute:

causing the state in each of the plurality of pixels to correspond to a plurality of states of a plurality of bits of an Ising model, and setting an evaluation function for evaluating a degree of coincidence between the target image and the formed image as a function of the plurality of bits; and determining which one of the plurality of states is to be set for each of the plurality of pixels on a basis of states of the plurality of bits included in a result obtained by evaluating the evaluation function by an Ising machine.

* * * * *